US005212458A

United States Patent [19]

Fitzpatrick et al.

[11] Patent Number: 5,212,458

[45] Date of Patent: May 18, 1993

[54] CURRENT MIRROR COMPENSATION CIRCUIT

[75] Inventors: Mark E. Fitzpatrick; Robert C. Burd, both of San Jose, Calif.

[73] Assignee: TriQuint Semiconductor, Inc., Santa Clara, Calif.

[21] Appl. No.: 764,020

[22] Filed: Sep. 23, 1991

[51] Int. Cl.[5] .............................................. H03F 3/45

[52] U.S. Cl. .................................... 330/288; 330/257

[58] Field of Search ................ 307/494, 497; 323/315, 323/316; 330/9, 253, 257, 277, 288

[56] References Cited

U.S. PATENT DOCUMENTS 4,992,755 2/1991 Seevinck et al. ............... 330/257 X

*Primary Examiner*—Steven Mottola
*Attorney, Agent, or Firm*—Skjerven, Morrill, MacPherson, Franklin & Friel

[57] ABSTRACT

A current mirror compensation circuit is disclosed herein which automatically adjusts the operating conditions of a current mirror so as to compensate for the voltage dependent current characteristics of a current load which a current mirror output is intended to match. In one embodiment, this compensation circuit compares a voltage level at the output of a current source with a voltage level at a corresponding node in the current programming portion of a current mirror. If a difference in these voltages is detected, the compensation circuit adjusts the current flow through the current programming portion of the current mirror to be equal to the output current through the current source. Therefore, since the current mirror output portion mirrors the current through the programming position, the currents through the output portion will match the current through the current source.

8 Claims, 3 Drawing Sheets

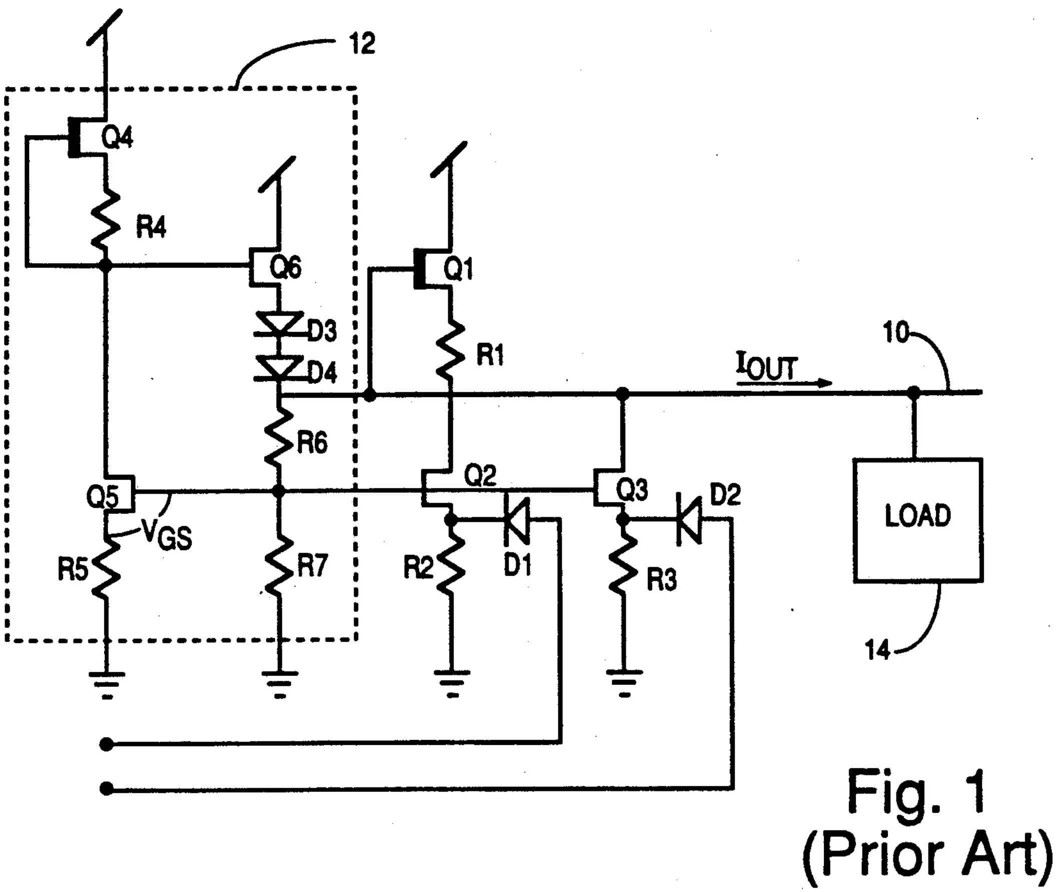
Fig. 1
(Prior Art)
Fig. 2
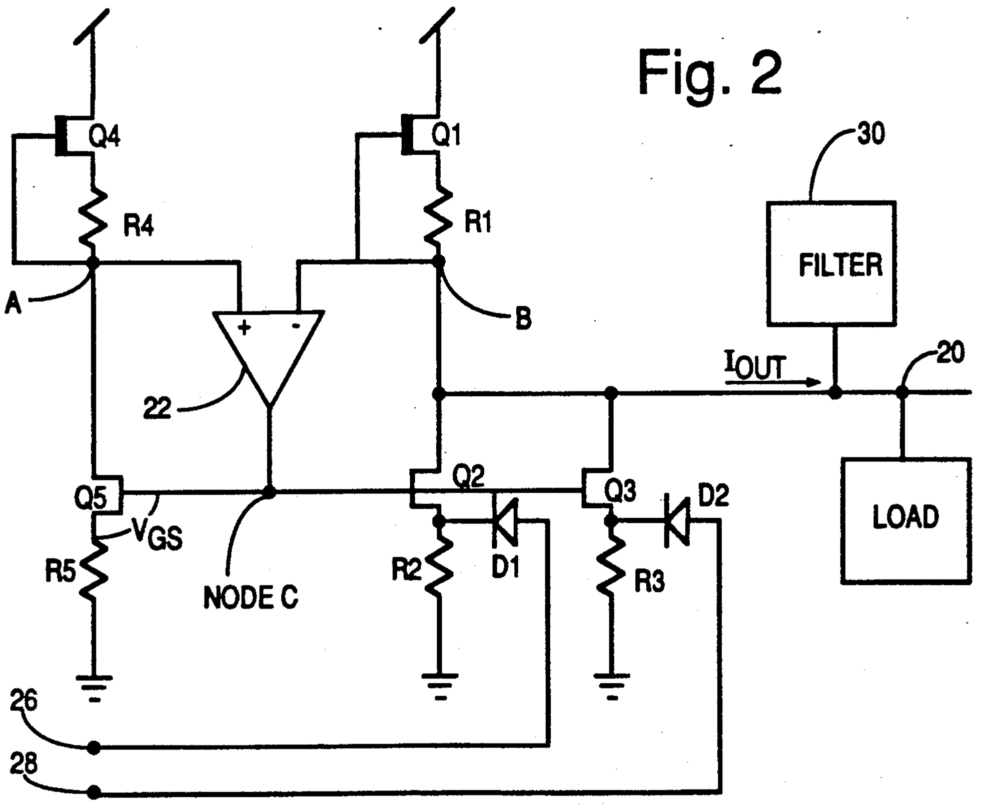

CURRENT MIRROR COMPENSATION CIRCUIT

FIELD OF THE INVENTION

This invention relates to current matching circuitry and, in particular, to a circuit for improving the performance of current matching circuitry.

BACKGROUND OF THE INVENTION

In an earlier patent application, Ser. No. 07/506,418, now U.S. Pat. No. 5,063,343, entitled "Current Pump Structure," a current matching circuit is disclosed similar to that shown in FIG. 1. This circuit of FIG. 1 consists of an output current source comprising transistor Q1 and resistor R1, a current mirror output portion comprising switchable transistors Q2 and Q3, and a current mirror programming portion comprising the circuitry within dashed-outline 12.

Basically, the current mirror of FIG. 1 operates to generate the same current through current mirror output transistors Q2 and Q3 (assuming diodes D1 and D2 are off) as is being generated through transistor Q5 by providing a same gate-source voltage to each of transistors Q2, Q3, and Q5. The current source comprising transistor Q4 and resistor R4 is used to match the output current source. In this way, ideally, the current supplied to output terminal 10 through transistors Q1 and R1 will be equal to the current sunk through either transistor Q2 or transistor Q3. By controlling diodes D1 and D2 to conduct or not conduct, a plus current, a minus current, or a zero current may be generated at output terminal 10.

This current matching circuit of FIG. 1 operates adequately for most purposes. However, for non-ideal output current sources, the current supplied to output terminal 10 will change as the voltage on terminal 10 increases. For example, when the depletion mode transistor Q1 is fabricated using Gallium Arsenide (GaAs) technology, the current flow through transistor Q1 is undesirably varied by a change in voltage at the source of transistor Q1 due to a change in voltage on output terminal 10. This effect on the current flow through transistor Q1 due to a change in voltage at the source of transistor Q1 is called backgating.

Backgating is a voltage related phenomena occurring in GaAs devices, which is similar to the body effect found in MOS devices. A negative bias on the substrate with respect to the source depletes the channel under a gate 5 further, such that a more positive potential is required on the gate to invert the channel and turn the device ON. The effect is a positive increase in the device threshold voltage $V_T$ necessary to the turn on the device.

In the depletion mode transistor Q1 of FIG. 1, serving as a current source, the drain voltage is fixed, and the gate and source nodes move with respect to ground and the substrate (tied to ground). Therefore, when the source voltage moves due to a change in voltage on output terminal 10, the current outputted by transistor Q1 will no longer match the current being sunk by either transistor Q2 or Q3.

As another example, MOS designers would experience the same problem (called body effect) if they used NMOS devices for VCC anchored current sources.

Thus, current source circuits (such as transistor Q1 and resistor R1) using GaAs or NMOS devices may undesirably produce an output current which varies with a change in an output voltage.

What is needed is a compensation circuit for a current mirror (such as the current mirror comprising transistors Q2 and Q3) which causes the current mirror to generate a current output which mirrors the voltage dependent behavior of a current load (such as the current source comprising transistor Q1 and resistor R1) which the current mirror output is intended to match.

SUMMARY OF THE INVENTION

A current mirror compensation circuit is disclosed herein which automatically adjusts the operating conditions of a current mirror so as to compensate for the voltage dependent current characteristics of a current load which a current mirror output is intended to match. In one embodiment, this compensation circuit compares a voltage level at the output of a current source (providing an output current to an output terminal) with a voltage level at a corresponding node in the current programming portion of a current mirror. If a difference in these voltages is detected, the compensation circuit adjusts the current flow through the current programming portion of the current mirror to be equal to the output current through the current source. Therefore, since the current mirror output portion mirrors the current through the programming portion, the current through the current mirror output portion will match the current through the current source.

BRIEF DESCRIPTION OF THE DRAWINGS

FIG. 1 shows a prior art circuit which suffers from voltage dependent behavior of an output current load.

FIG. 2 illustrates one embodiment of the current mirror compensation circuit connected in the circuit of FIG. 1 to compensate for such voltage dependent behavior.

DETAILED DESCRIPTION OF THE PREFERRED EMBODIMENT

Figure 3:
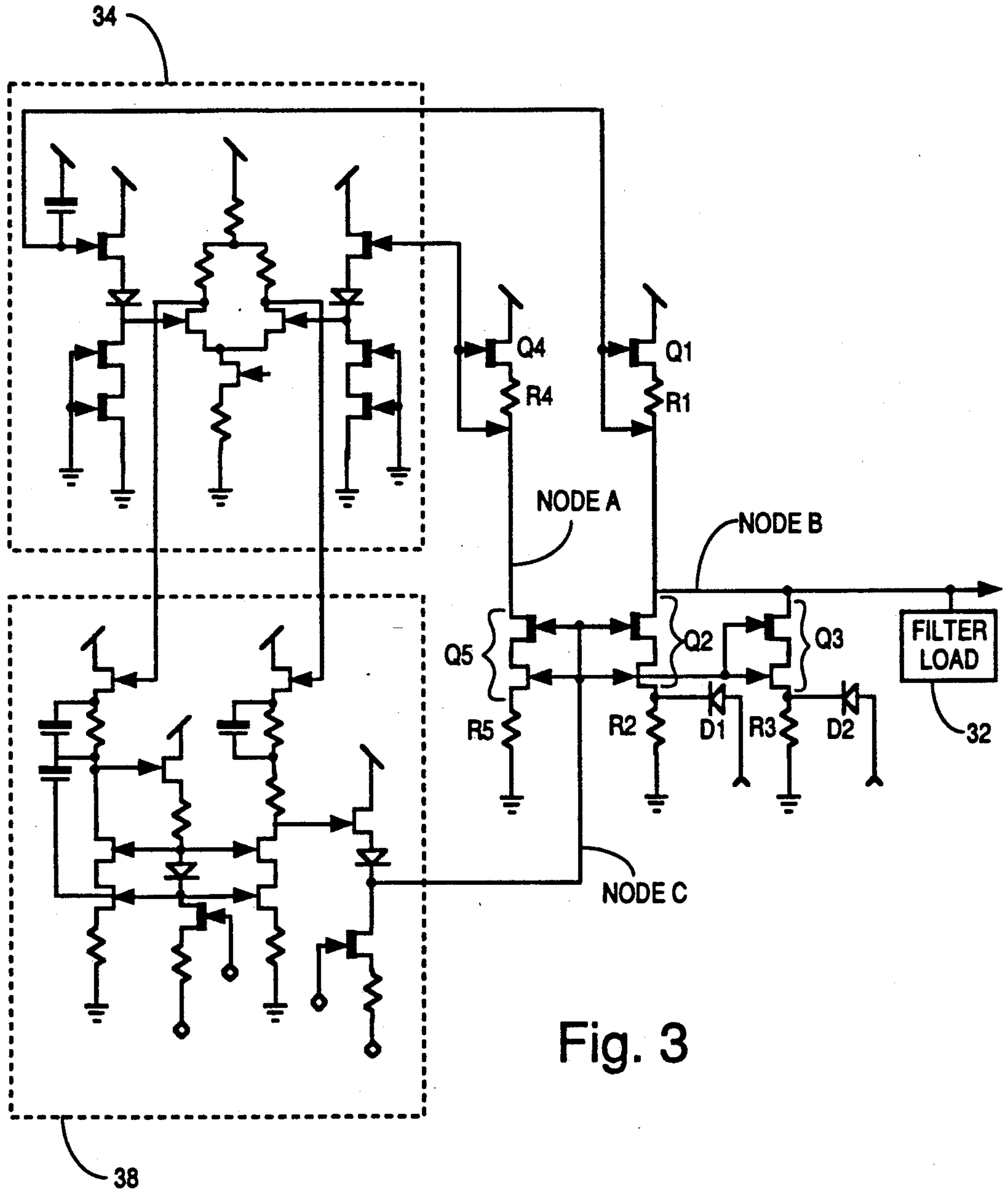
FIG. 3 illustrates a preferred embodiment of the compensation circuit.

FIG. 2 shows one embodiment of the invention comprising differential amplifier 22 connected in the current mirror circuit of FIG. 1 to compensate for the voltage dependent behavior of the current source comprising transistor Q1 and resistor R1, due to, for example, backgating effects. Without compensation, this voltage dependent behavior could cause the current through transistor Q1 to not be identical to the current through transistors Q2 or Q3 if the voltage at output terminal 20 (or node B) is not the same as the voltage at node A. This is due to there being different operating conditions for transistors Q1 and Q4, causing these two current sources to generate unmatched currents.

Differential amplifier 22 effectively balances the voltages at the gates of transistors Q4 and Q1 (nodes A and B) by adjusting the voltage at node C until the current through transistor Q5 causes the voltage at node A to equal the voltage at node B. The voltage at the gate of transistor Q1 (node B) may be held substantially constant during this compensation process by any appropriate means, if necessary, such as by a filter 30. Thus, a change in voltage applied to the gate of transistor Q2 will not immediately affect the voltage at node B.

Differential amplifier 22 is merely representative of any circuit which detects a difference in two voltage levels and outputs a signal corresponding to this difference.

The dynamic operation of the circuit of FIG. 2 is as follows. Given a steady state condition, a certain current will flow through transistor Q1, resistor R1, transistor Q2, and resistor R2 to ground, assuming diode D1 is controlled to be off by a low signal applied to terminal 26. For the below discussion, it will also be assumed that diode D2 is turned on by a high voltage being applied to terminal 28 so as to turn transistor Q3 off.

A certain voltage is applied to the common control terminals of both transistors Q2 and Q5 during this steady state condition, so that, ideally, the currents flowing through transistors Q1, Q2, Q4 and Q5 are identical.

If a changed condition causes the output voltage at node B to be raised, this will change the source-to-substrate voltage of depletion mode transistor Q1, and, due to the voltage dependent behavior of transistor Q1, the current through transistor Q1 will be reduced. Therefore, without any compensation circuit, the current flowing through transistor Q1 will not be the same as the current flowing through transistor Q4, and, consequently, the current through transistor Q1 will not match the current through transistor Q2.

Differential amplifier 22 acts as a compensation means to match the currents through transistors Q1 and Q4 by comparing the difference in voltages at nodes A and B and outputting a voltage corresponding to this difference. This output, assuming the voltage at node B is greater than that at node A, then lowers the voltage applied to the gates of transistors Q2 and Q5 until the voltage at node A equals that of node B.

Thus, the operating conditions of all the transistors in the current mirror circuit of FIG. 2 are now identical, and hence, transistors Q1, Q2, Q4, and Q5 will now generate matching currents.

In the particular current mirror circuit configuration of FIG. 2, filter 30 acts to delay any change in the voltage at node B during this compensation, or otherwise any change in the voltage at node C would instantaneously change the voltage at node B, and oscillations may occur. Thus, filter 30 must have characteristics sufficient to delay any change in the voltage on node B until compensation has been achieved.

In another embodiment, the output current load is not directly connected to the current mirror output portion so that an adjustment of the current through the current mirror output portion by the compensation circuit does not affect the operating environment of the output current load. Therefore, in this case, a filter may not be needed.

It will be understood by those skilled in the art that any of a number of means for detecting an output voltage of a current mirror and providing the compensation which has been described above may be used in place of differential amplifier 22.

FIG. 3 illustrates one embodiment of a current mirror compensation circuit which may be used in a current mirror similar to that shown in FIG. 2.

In FIG. 3, a programming portion of the current mirror comprises transistor Q4, resistor R4, transistor Q5, and resistor R5, generally corresponding to the identically named components in FIG. 2. An output portion of the current mirror comprises transistors Q2 and Q3, and resistors R2 and R3. The operation of these components is similar to that described in FIG. 2. Transistors Q2 and Q3 are switchably controlled by control signals applied to the anodes of diodes D1 and D2.

In FIG. 3, as in FIG. 2, a current output is provided at node B to a low pass filter/load 32 for preventing rapid changes in the voltage at node B.

As seen in FIG. 3, the voltage at node B is coupled to an input of compensation circuit 34, which, in the embodiment of FIG. 3, is a differential amplifier for comparing the difference in voltages at nodes A and B.

The differential output of differential amplifier 34 is applied to a differential-to-single-ended conversion circuit 38. Circuit 38 then applies a single-ended signal based on the output of differential amplifier 34 to node C for controlling the current flow through current mirror transistors Q2, Q3, and Q5.

Hence, the circuitry of FIG. 3 operates similar to the circuitry shown in FIG. 2 and is constructed using circuit techniques well known to those of ordinary skill in the art.

As would be obvious to one of ordinary skill in the art after reading this disclosure, differential amplifier 34 and circuit 38 may be replaced by a variety of circuits which produce a voltage dependent upon a comparison of two input voltages.

Figure 4:
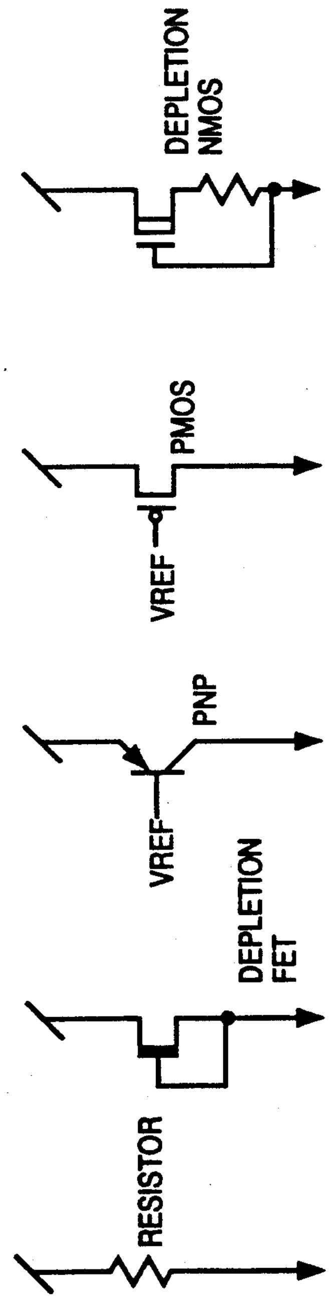
FIG. 4 illustrates other possible embodiments of an output current load which may have voltage dependent output current characteristics.

The output current load comprising transistor Q1 and resistor R1 in FIGS. 2 and 3 may be any current load circuit, such as those shown in FIG. 4. If an alternative current load circuit was used in FIGS. 2 and 3, transistors Q4 and R4, forming part of the current mirror programming portion, would be replaced with a circuit identical to the output current load used.

Thus, a compensation circuit has been disclosed herein which when used in a current matching circuit, such as a current mirror circuit, allows the current mirror output to track the voltage dependent current characteristics of a current load it is intended to match.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A compensation circuit connected in a current matching circuit, said current matching circuit including a current mirror programming portion, a current mirror output portion, and a current load output portion, said compensation circuit comprising:

a means for comparing a voltage at a first node of said current load output portion with a corresponding second node of said current mirror programming portion;

said means for comparing having an output terminal coupled to said current mirror programming portion and said current mirror output portion to control a first current through said current mirror output portion to match a second current through said current load output portion.

2. The compensation circuit of claim 1 wherein said means for comparing adjusts a voltage at said second node to be equal to a voltage at said first node.

3. The compensation circuit of claim 2 wherein said current mirror programming portion includes a first current load substantially identical to said current load output portion.

4. The compensation circuit of claim 3 wherein said first current load comprises a first transistor having a first current handling terminal coupled to a substantially fixed voltage, a second current handling terminal coupled to said second node, and a gate coupled to said second node.

5. The compensation circuit of claim 4 wherein said first current load and said current load output portion contain one or more GaAs transistors.

6. The compensation circuit of claim 4 wherein said gate is directly coupled to said second node and said second current handling terminal is coupled to said second node through a resistor.

7. The compensation circuit of claim 2 wherein said means for comparing is a differential amplifier having an output terminal connected to a common gate terminal of a first current load transistor in said current mirror programming portion and a second current load transistor in said current mirror output portion.

8. The compensation circuit of claim 1 wherein a low pass filter is connected to an output terminal of said current mirror matching circuit to allow said voltage at said second node to be controlled by said compensation circuit while said voltage at said first node is held substantially constant.

* * * * *